United States Patent
Reddy et al.

(10) Patent No.: US 12,067,745 B2
(45) Date of Patent: Aug. 20, 2024

(54) IMAGE PRE-PROCESSING FOR OVERLAY METROLOGY USING DECOMPOSITION TECHNIQUES

(71) Applicant: KLA Corporation, Milpitas, CA (US)

(72) Inventors: Nireekshan K. Reddy, Tel Aviv (IL); Vladimir Levinski, Migdal HaEmek (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/371,853

(22) Filed: Sep. 22, 2023

(65) Prior Publication Data

US 2024/0119626 A1    Apr. 11, 2024

Related U.S. Application Data

(60) Provisional application No. 63/410,233, filed on Sep. 27, 2022.

(51) Int. Cl.
| | | |
|---|---|---|
| G06T 7/00 | (2017.01) | |
| G06T 5/70 | (2024.01) | |
| G06T 7/73 | (2017.01) | |

(52) U.S. Cl.
CPC .................. *G06T 7/73* (2017.01); *G06T 5/70* (2024.01); *G06T 7/0004* (2013.01)

(58) Field of Classification Search
None
See application file for complete search history.

(56) References Cited

U.S. PATENT DOCUMENTS

| | | |
|---|---|---|
| 2018/0252514 A1 | 9/2018 | Pandev et al. |
| 2019/0252270 A1 | 8/2019 | Hoo et al. |
| 2019/0271542 A1 | 9/2019 | Shchegrov et al. |
| 2020/0327654 A1* | 10/2020 | Zhang .................. G06T 7/0004 |

(Continued)

FOREIGN PATENT DOCUMENTS

WO    2021107986 A1    6/2021

OTHER PUBLICATIONS

Zhang, Chenyu, et al. "Denoising atomic resolution 4D scanning transmission electron microscopy data with tensor singular value decomposition." Ultramicroscopy 219 (2020): 113123. (Year: 2020).*

(Continued)

*Primary Examiner* — Sean M Conner
(74) *Attorney, Agent, or Firm* — Suiter Swantz IP

(57) ABSTRACT

A system may include a controller for receiving one or more images of a metrology target including periodic features with one or more known pitches, pre-processing the one or more images using a decomposition technique to generate one or more pre-processed images, and generating one or more metrology measurements for the metrology target based on the one or more pre-processed images. Pre-processing a particular image of the one or more images may include constructing one or more trajectory matrices from the particular image, generating reconstruction components associated with the particular image from the one or more trajectory matrices using the decomposition technique, and generating a particular one of the one or more pre-processed images by based on a subset of the reconstruction components including signals with at least one of the one or more known pitches.

23 Claims, 9 Drawing Sheets

(56) References Cited

U.S. PATENT DOCUMENTS

2022/0283514 A1 9/2022 Hill et al.
2023/0165904 A1 6/2023 Itescu

OTHER PUBLICATIONS

Lichtert, Stijn, and Jo Verbeeck. "Statistical consequences of applying a PCA noise filter on EELS spectrum images." Ultramicroscopy 125 (2013): 35-42. (Year: 2013).*
Korean Intellectual Property Office, International Search Report and Written Opinion received in International Application No. PCT/US2023/033656, Jan. 16, 2024, 6 pages.

* cited by examiner

IMAGE PRE-PROCESSING FOR OVERLAY METROLOGY USING DECOMPOSITION TECHNIQUES

CROSS-REFERENCE TO RELATED APPLICATION

The present application claims the benefit under 35 U.S.C. § 119(e) of U.S. Provisional Application Ser. No. 63/410,233, filed Sep. 27, 2022, entitled ON PRE-PROCESSING MEASURED IMAGES AND SIGNALS FOR ACCURATE OVERLAY EXTRACTION, naming Nireekshan K. Reddy and Vladimir Levinski as inventors, which is incorporated herein by reference in the entirety.

TECHNICAL FIELD

The present disclosure relates generally to overlay metrology and, more particularly, to pre-processing of images for overlay metrology.

BACKGROUND

Many metrology techniques rely on images of periodic structures on a sample. However, the images collected may suffer from various sources of noise and non-uniformities with length scales different than the periodicity of the structures of interest that may negatively impact the measurement such as, but not limited to, detector-derived noises, target-derived noises, or illumination non-uniformities. There is therefore a need to develop systems and methods to cure the above deficiencies.

SUMMARY

A system is disclosed in accordance with one or more illustrative embodiments of the present disclosure. In one illustrative embodiment, the system includes a controller. In another illustrative embodiment, the controller receives one or more images of a metrology target including periodic features with one or more known pitches. In another illustrative embodiment, the controller pre-processes the one or more images using a decomposition technique to generate one or more pre-processed images. In another illustrative embodiment, the controller generates one or more metrology measurements for the metrology target based on the one or more pre-processed images. In another illustrative embodiment, pre-processing a particular image of the one or more images includes constructing one or more trajectory matrices from the particular image, generating reconstruction components associated with the particular image from the one or more trajectory matrices using the decomposition technique, and generating a particular one of the one or more pre-processed images by based on a subset of the reconstruction components including signals with at least one of the one or more known pitches.

A system is disclosed in accordance with one or more illustrative embodiments of the present disclosure. In one illustrative embodiment, the system includes a metrology sub-system and a controller. In another illustrative embodiment, the controller receives one or more images of a metrology target including periodic features with one or more known pitches from the metrology sub-system. In another illustrative embodiment, the controller pre-processes the one or more images using a decomposition technique to generate one or more pre-processed images. In another illustrative embodiment, the controller generates one or more metrology measurements for the metrology target based on the one or more pre-processed images. In another illustrative embodiment, pre-processing a particular image of the one or more images includes constructing one or more trajectory matrices from the particular image, generating reconstruction components associated with the particular image from the one or more trajectory matrices using the decomposition technique, and generating a particular one of the one or more pre-processed images by based on a subset of the reconstruction components including signals with at least one of the one or more known pitches.

A method is disclosed in accordance with one or more illustrative embodiments of the present disclosure. In one illustrative embodiment, the method includes receiving one or more images of a metrology target including periodic features with one or more known pitches. In another illustrative embodiment, the method includes pre-processing the one or more images using a decomposition technique to generate one or more pre-processed images. In another illustrative embodiment, pre-processing a particular image of the one or more images includes constructing one or more trajectory matrices from the particular image, generating reconstruction components associated with the particular image from the one or more trajectory matrices using the decomposition technique, and generating a particular one of the one or more pre-processed images by based on a subset of the reconstruction components including signals with at least one of the one or more known pitches. In another illustrative embodiment, the method includes generating one or more metrology measurements for the metrology target based on the one or more pre-processed images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1A:
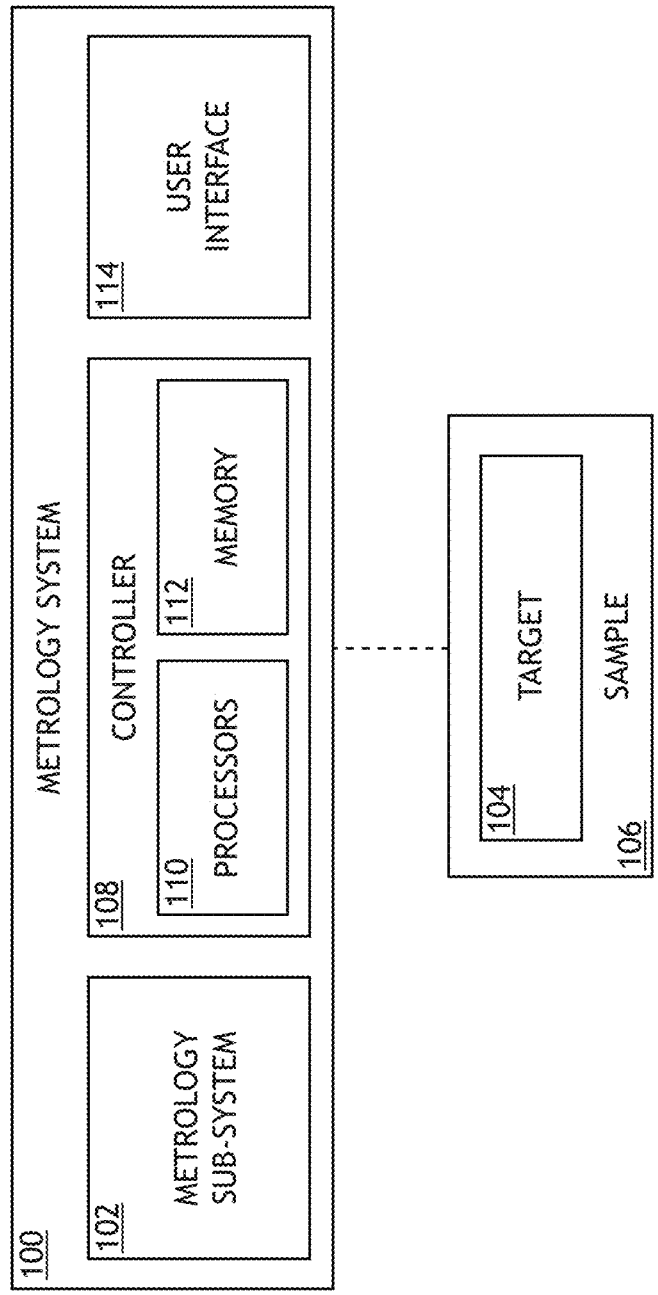
FIG. 1A is a block diagram of a metrology system for generating and/or utilizing pre-processed images, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods providing pre-processing of images with periodic features using a matrix decomposition (e.g., factorization) technique. The systems and methods disclosed herein may be suitable for, but not limited to, pre-processing images of periodic targets used in metrology applications such as, but not limited to, overlay metrology.

It is contemplated herein that many image-based metrology techniques may be sensitive to noise and/or non-uniformities present in an image. Typical approaches for providing accurate measurements focus on hardware-based techniques for avoiding such noise and/or non-uniformities. However, it may be impractical or undesirable (e.g., due to cost or other constraints) to fully remove such noise and/or non-uniformities from images. In such cases, it may be desirable to pre-process images prior to generating image-based measurements, which may allow the use of any suitable measurement and/or analysis technique.

In embodiments, one or more trajectory matrices are constructed for an image. A matrix decomposition technique such as, but not limited to, singular value decomposition (SVD) or a variant thereof may then be used to generate reconstruction components associated with the image based on the trajectory matrices, where the reconstruction components may represent a decomposition of the image into different spectral components (e.g., different length scales). In this way, the reconstruction components may represent portions of the image corresponding to different length scales. A pre-processed (e.g., a filtered image) may then be generated based on a subset of the reconstruction components that correspond to a known pitch of the overlay target in the image. Such a pre-processed image may include a high contrast representation of the periodic overlay target, where noise and/or non-uniformities at other length scales are effectively removed or suppressed.

It is contemplated that such a technique may provide robust and universal filtering of images of periodic targets. In particular, the generation of reconstruction vectors using decomposition techniques may identify dominant length scales (e.g., spectral components) in an image based on the image itself to promote efficient and accurate filtering of data at unwanted length scales. It is recognized that a universal metrology model incorporating decomposition of trajectory matrices including metrology values from targets distributed across a sample is described in U.S. patent application Ser. No. 17/995,385 filed on Sep. 28, 2022, which is incorporated herein by reference in its entirety. The systems and methods disclosed herein may utilize, but is not limited to, similar decomposition techniques as described in U.S. patent application Ser. No. 17/995,385, but where these mathematical decomposition are applied to different datasets at a different stage of a metrology process. For instance, the systems and methods disclosed herein apply decomposition techniques to identify and isolate dominant lengths scales in an image associated with periodic features of interest as a pre-processing step prior to generating a metrology measurement. Subsequently, metrology data generated from multiple targets across a sample may be modeled or further processed using any suitable technique such as, but not limited to, techniques described in U.S. patent application Ser. No. 17/995,385.

The trajectory matrices may be generated in any suitable manner and may be tailored based on the complexity of the overlay target being imaged (e.g., whether the target has periodicity along one dimension or multiple dimensions) and/or computational considerations. In particular, the number of trajectory matrices constructed and/or the embedding dimension may be tailored for a particular application.

As an example in the case of an image of a target having one-dimensional (1D) periodicity oriented along rows of the image, one or more trajectory matrices may be generated based on one or more of the rows of the image. In some embodiments, trajectory matrices are generated for each row of the image (or a portion thereof corresponding to a region of interest (ROI)) and then combined in a grand trajectory matrix. In some embodiments, a single trajectory matrix is generated for a single row of the image or a portion thereof. In some embodiments, a trajectory matrix is generated based on an average of two or more rows of the image or a portion thereof. Reducing the number of trajectory matrices may increase computational throughput (e.g., decrease computation time), but may potentially reduce the robustness of the analysis.

The embedding dimension may be selected based on the needs of a particular application. In some embodiments, the embedding dimension is selected to be the length of a row or column in the image. This configuration may correspond to a straightforward SVD implementation on the selected rows of the image and may generate the reconstruction components based on correlations between the different rows. Such a configuration may also be relatively computationally fast. In some embodiments, the embedding dimension is selected to be a known pitch of the target (e.g., in units of pixels). Such a configuration may generate the reconstruction components based on correlations between repeating patterns (e.g., different periods) within each row and between different rows. Such a configuration may thus provide a more statistically valid decomposition of the image and may thus provide reconstruction components that more accurately represent the various length scales in the image, but may require relatively longer computation times.

Additional embodiments of the present disclosure are directed to process control utilizing metrology data generated based on pre-processed images as disclosed herein. In this way, metrology data may be used directly or indirectly for feedback and/or feed-forward control of any number of process tools such as, but not limited to, lithography tools (e.g., scanners and/or steppers), deposition tools, etching tools, or polishing tools. As an illustration, metrology data for samples in a lot may be used to generate feedback correctables for controlling the lithographic exposure of subsequent samples in the same lot. As another illustration, metrology data for samples in a lot may be used to generate feed-forward correctables for controlling lithographic exposures for the same or similar samples in subsequent lithography steps to account for any deviations in the current exposure.

Referring now to FIGS. 1A-4C, systems and methods for pre-processing images of periodic features are described in greater detail, in accordance with one or more embodiments of the present disclosure.

FIG. 1A is a block diagram of a metrology system 100 for generating and/or utilizing pre-processed images, in accordance with one or more embodiments of the present disclosure.

In embodiments, the metrology system 100 includes a metrology sub-system 102 suitable for generating metrology measurements of targets 104 (e.g., metrology targets) distributed across one or more samples 106.

The sample 106 may include any object that is the source of a metrology measurement. For example, the sample 106 may include a substrate formed of a semiconductor or non-semiconductor material (e.g., a wafer, or the like). A semiconductor or non-semiconductor material may include, but is not limited to, monocrystalline silicon, gallium arsenide, and indium phosphide. The sample 106 may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample 106 may be patterned or unpatterned. For example, a sample 106 may include a plurality of dies, each having repeatable patterned features. Formation and processing of such layers of material may ultimately result in completed devices. Many different types of devices may be formed on a sample 106, and the term sample 106 as used herein is intended to encompass a sample 106 on which any type of device known in the art is being fabricated. Further, for the purposes of the present disclosure, the term sample 106 and wafer should be interpreted as interchangeable.

The metrology measurements of a sample 106 generated by the metrology sub-system 102 may provide any type of data and may be generated using any technique known in the art. In some embodiments, the metrology measurements generated by the metrology sub-system 102 are overlay measurements characterizing registration (or registration errors) between different lithographic exposures on one or more layers of a sample 106. In some embodiments, the metrology measurements generated by the metrology sub-system 102 characterize conditions of a lithographic exposure such as, but not limited to, a focal position of a sample 106 or an illumination dose. In some embodiments, the metrology measurements generated by the metrology sub-system 102 characterize additional aspects of a fabrication process such as, but not limited to, an etching step or a polishing step.

A target 104 may include any location on the sample 106 suitable for a metrology measurement with a metrology sub-system 102. In some embodiments, a target 104 includes features associated with a device being fabricated, which are referred to herein as device features. In some embodiments, a target 104 includes dedicated features designed to facilitate metrology measurements. As an illustration in the context of overlay metrology, a dedicated overlay target 104 may include features associated with each of the lithographic exposures of interest in overlapping or non-overlapping positions on the sample 106 in an arrangement that enables robust and accurate overlay measurements by the metrology sub-system 102.

The metrology sub-system 102 may be configured to implement a metrology recipe. A recipe may include various parameters and/or conditions that govern the acquisition of measurements across at least one sample 106. For example, a recipe may include parameters associated with a number of regions of a sample 106 to characterize (e.g., targets), placement of targets, and/or an order of measurement of such targets. Further, in applications where the targets are designed for the purposes of a measurement (e.g., metrology targets, overlay targets, or the like), the recipe may include aspects of the design of such targets including, but not limited to, the layout of features on one or more layers. As another example, a recipe may include parameters associated with the configuration of the metrology sub-system 102 during a measurement. As an illustration, a recipe may include parameters associated with illumination of a target 104 such as, but not limited to, wavelength, polarization, power, angle of incidence, spot size, or a number of illumination beams. As another illustration, a recipe may include parameters associated with collection of light from a target 104 such as, but not limited to, wavelength, polarization, or collection angle. As another example, a recipe may include various processing and/or analysis steps associated with generating metrology measurements based on generated data.

In embodiments, the metrology system 100 includes a controller 108 communicatively coupled to any components therein. The controller 108 may include one or more processors 110. For example, the one or more processors 110 may be configured to execute a set of program instructions maintained in a memory device 112, or memory. The one or more processors 110 of a controller 108 may include any processing element known in the art. In this sense, the one or more processors 110 may include any microprocessor-type device configured to execute algorithms and/or instructions.

The one or more processors 110 of a controller 108 may include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 110 may include any device configured to execute algorithms and/or instructions (e.g., program instructions stored in memory). In some embodiments, the one or more processors 110 may be embodied as a desktop computer, mainframe computer system, workstation, image computer, parallel processor, networked computer, or any other computer system configured to execute a program configured to operate or operate in conjunction with the metrology system 100, as described throughout the present disclosure. Moreover, different sub-systems of the metrology system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 108 may include one or more controllers housed in a common housing or within multiple housings. In this way, any controller or combination of controllers may be separately packaged as a module suitable for integration into the metrology system 100.

The memory device 112 may include any storage medium known in the art suitable for storing program instructions executable by the associated one or more processors 110. For example, the memory device 112 may include a non-transitory memory medium. By way of another example, the memory device 112 may include, but is not limited to, a read-only memory (ROM), a random-access memory (RAM), a magnetic or optical memory device (e.g., disk), a magnetic tape, a solid-state drive and the like. It is further noted that the memory device 112 may be housed in a common controller housing with the one or more processors 110. In some embodiments, the memory device 112 may be located remotely with respect to the physical location of the one or more processors 110 and the controller 108. For instance, the one or more processors 110 of the controller 108 may access a remote memory (e.g., server), accessible through a network (e.g., internet, intranet and the like).

The controller 108 may direct (e.g., through control signals) and/or receive data from any components or sub-systems of the metrology system 100 such as, but not limited to, the metrology sub-system 102 as well as other system such as one or more process tools for fabricating samples 106 (e.g., a lithography tool, or the like). The controller 108 may further be configured to perform any of the various process steps described throughout the present disclosure such as, but not limited to, implementing a metrology recipe, pre-processing one or more images, or generating metrology measurements based on pre-processed images.

In some embodiments, the metrology system 100 includes a user interface 114 communicatively coupled to the controller 108. In some embodiments, the user interface 114 may include, but is not limited to, one or more desktops, laptops, tablets, and the like. In some embodiments, the user interface 114 includes a display used to display data of the metrology system 100 to a user. The display of the user interface 114 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 114 is suitable for implementation in the present disclosure. In some embodiments, a user may input selections and/or instructions responsive to data displayed to the user via a user input device of the user interface 114.

Referring now to FIGS. 2A-4C, techniques for modeling metrology measurements are described in greater detail, in accordance with one or more embodiments of the present disclosure.

Figure 2A:
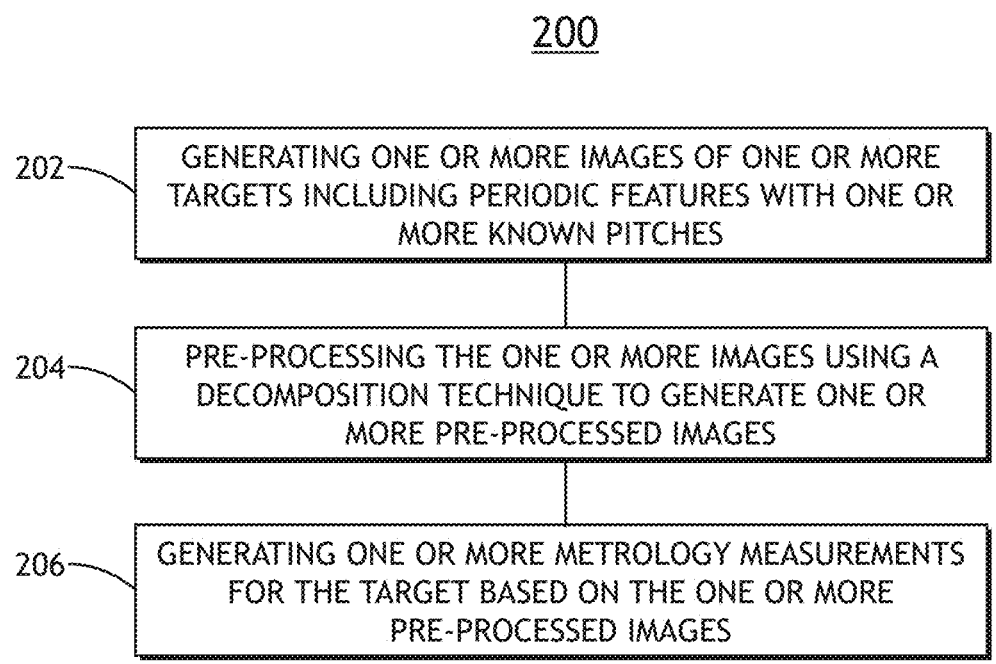
FIG. 2A is a flow diagram illustrating steps performed in a method, in accordance with one or more embodiments of the present disclosure.

FIG. 2A is a flow diagram illustrating steps performed in a method 200, in accordance with one or more embodiments of the present disclosure. Applicant notes that the embodiments and enabling technologies described previously herein in the context of the metrology system 100 should be interpreted to extend to the method 200. For example, the processors 110 of the controller 108 may execute program instructions causing the processors 110 to implement any of the steps of the method 200. In some embodiments, at least some of the steps of the method 200 may be implemented as part of a metrology recipe by any combination of components of the metrology system 100. It is further noted, however, that the method 200 is not limited to the architecture of the metrology system 100.

In some embodiments, the method 200 includes a step 202 of generating one or more images of one or more targets 104 including periodic features with one or more known pitches. In some embodiments, the method 200 includes a step 204 of pre-processing the one or more images using a decomposition technique to generate one or more pre-processed images. In some embodiments, the method 200 includes a step 206 of generating one or more metrology measurements for the target 104 based on the one or more pre-processed images. More generally, the step 206 may include generating any type or number of metrology measurements based on any number of targets 104. For example, the imaged targets 104 may be, but are not required to be, overlay targets 104 suitable for overlay metrology measurements.

The images in step 202 may be generated using any suitable tool such as, but not limited to, the metrology sub-system 102. Further, the images may be generated using any suitable optical imaging technique including, but not limited to, brightfield or darkfield imaging.

The targets 104 may have any design suitable for any type of metrology measurement. For example, the targets 104 may have periodic features on one or more layers of a sample 106 (e.g., sample layers).

Figure 3:
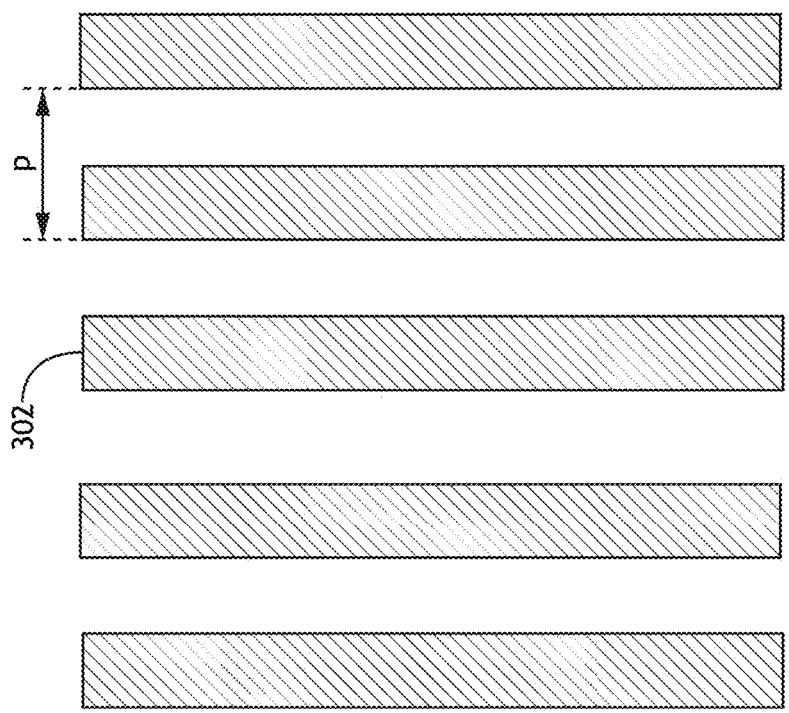
FIG. 3 is a simplified top image of a target including periodic structures, in accordance with one or more embodiments of the present disclosure.

FIG. 3 is a simplified top image of a target 104 including periodic structures 302, in accordance with one or more embodiments of the present disclosure. In particular, FIG. 3 the periodic structures 302 are shown as line/space features with a pitch p.

In some embodiments, a target 104 or a cell thereof may include a single instance of periodic structures 302. In some embodiments, a target 104 or a cell thereof may include multiple instances of periodic structures 302 in an overlapping or non-overlapping configuration, where the different instances of the periodic structures 302 may have the same or different pitches (e.g., values of p).

For example, in the non-limiting application of overlay metrology, a target 104 may include different instances of such periodic structures 302 on one or more sample layers that are associated with different lithographic exposures. In this way, an overlay measurement (e.g., generated in step 206) associated with a measurement of relative registration between features associated with the different lithographic exposures may be provided based on the relative positions of the different instances of the periodic structures 302. As an illustration, a target 104 may include non-overlapping instances of periodic structures 302 with the same or different pitches. For instance, the target 104 may be characterized as an advanced imaging metrology (AIM) target 104. As another illustration, a target 104 may include one or more regions of overlapping instances of periodic structures 302, which may be characterized as grating-over-grating structures. In the case of different pitches, such regions may also be referred to as Moiré structures and may further exhibit a Moiré pitch different than the pitches of the constituent periodic structures 302 (e.g., related to a difference between the pitches of the constituent periodic structures 302). For instance, a target 104 including one or more Moiré structures may be characterized as a robust AIM (e.g., rAIM) target 104.

In some embodiments, an overlay measurement may be generated (e.g., in step 206) based on differences between centers of symmetry of different regions of the target 104 (e.g., differences between centers of symmetry of different instances of the periodic structures 302, different instances of Moiré structures, or the like).

Figure 2B:
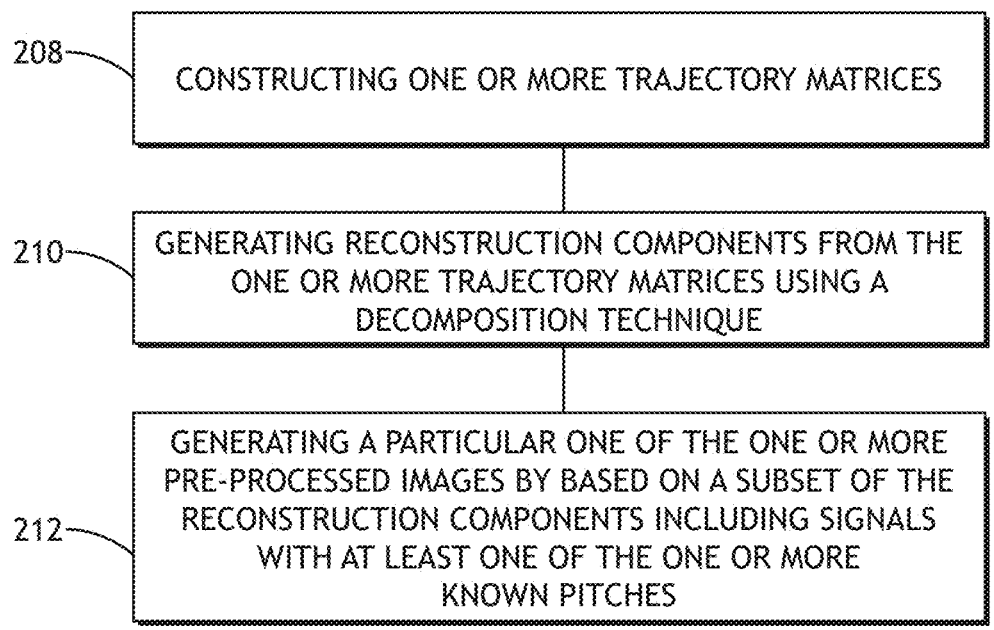
FIG. 2B is a flow diagram illustrating additional steps performed in the method, in accordance with one or more embodiments of the present disclosure.

FIG. 2B is a flow diagram illustrating additional steps performed in the method 200, in accordance with one or more embodiments of the present disclosure. In particular, FIG. 2B depicts various substeps that may be performed in step 204 when preprocessing a particular one of the one or more images to generate a particular one of the one or more pre-processed images. In this way, the steps depicted in FIG. 2B may be iterated for each of the images (or a portion of the images) captured in step 202.

In some embodiments, the step 204 includes a step 208 of constructing one or more trajectory matrices (e.g., from a particular image or ROI thereof).

An image may be represented as:

$$I_{Orig} = \begin{pmatrix} a_{1,1} & \cdots & a_{1,m} \\ \vdots & \ddots & \vdots \\ a_{n,1} & \cdots & a_{n,m} \end{pmatrix}, \quad (1)$$

where a represents a pixel value and n and m represent rows and columns, respectively. It is to be understood that $I_{Orig}$ may correspond to an entire image (e.g., an image generated by the metrology sub-system 102) or a ROI thereof. For example, $I_{Orig}$ may correspond to an ROI including a central portion of a target 104 (or a cell thereof) including periodic structures of interest. As an illustration, the ROI may be selected to avoid edges of a region of the periodic structures that may be more likely to experience fabrication defects.

The step 208 may include generating a trajectory matrix associated with any direction in the image that corresponds to a direction of periodicity of features of the target 104.

As an example in the case of a target 104 including periodic features oriented along the rows of an image, a trajectory matrix $\tau_k$ may be generated for any $k^{th}$ row as:

$$\tau_k = \begin{pmatrix} a_{k,1} & a_{k,2} & a_{k,3} & \cdots & a_{k,\mathcal{M}} \\ a_{k,2} & a_{k,3} & a_{k,4} & \cdots & a_{k,\mathcal{M}+1} \\ \vdots & \vdots & \vdots & \ddots & \vdots \\ a_{k,m-\mathcal{M}+1} & a_{k,m-\mathcal{M}+2} & a_{k,m-\mathcal{M}+3} & \cdots & a_{k,m} \end{pmatrix}_{(m-\mathcal{M}+1)\times\mathcal{M}}, \quad (2)$$

where $\mathcal{M}$ is an embedding dimension that may satisfy ($1 < \mathcal{M} < m$). Such a matrix may be characterized as a transfer matrix or a Hankel matrix and may have the property that elements on diagonals i+j=C are equal. Further, the trajectory matrices $\tau_k$ may be arranged into a grand trajectory matrix $\mathcal{G}$ for decomposition, which may be written as:

$$\mathcal{G} = (\tau_1 \cdots \tau_n)_{(m-\mathcal{M}+1)\times n\mathcal{M}} \quad (3)$$

As will be described in greater detail throughout the present disclosure, selection of the embedding dimension $\mathcal{M}$ may impact both the nature of the decomposition and the computation speed. For example, setting the embedding dimension $\mathcal{M}$ equal to a number of pixels in a row of an image $I_{Orig}$ (or an ROI thereof) may result in a simple decomposition (e.g., SVD) of the image. As another example, setting the embedding dimension $\mathcal{M}$ equal to a pitch of target features in units of pixels may provide reconstruction components based on correlations between segments of length $\mathcal{M}$ both within rows and between rows.

As another example, a single trajectory matrix may be generated for a single row of an image or in the case of a pure 1D image. In this case, the grant trajectory matrix $\mathcal{G}$ is equivalent to the single trajectory matrix. As another example, a trajectory matrix may be generated for an average of two or more rows of the image. For instance, a single trajectory matrix may represent the data in the entire image (or selected ROI). In another instance, every x rows may be averaged to reduce the overall size of an associated grand trajectory matrix $\mathcal{G}$.

It is noted that the description of a target 104 having periodic features oriented along rows of an image is merely illustrative and not limiting. In cases where a target 104 has periodic features oriented along columns of an image, trajectory matrices may be generated that correspond to any columns of the image or averages of columns.

Further, Equations (2)-(3) above are generated with an embedding dimension along a single direction. In cases where a target 104 has periodicity along two directions (e.g., the rows and columns of an image), one or more trajectory matrices may be generated using a two-dimensional window that provides embedding along two directions. Such a generalization may be used for 2-dimensional targets with no translational invariance. For example, the grand trajectory matrix $\mathcal{G}$ may be written in this case as:

$$\mathcal{G} = \begin{pmatrix} \tau_1 & \tau_2 & \tau_3 & \cdots & \tau_y \\ \tau_2 & \tau_3 & \tau_4 & \cdots & \tau_{y+1} \\ \vdots & \vdots & \vdots & \ddots & \vdots \\ \tau_x & \tau_{x+1} & \tau_{x+2} & \cdots & \tau_N \end{pmatrix}_{(m-\mathcal{M}+1)\times\mathcal{M}} \quad (4)$$

where each matrix $\tau_i$ is given as a trajectory matrix with a window size (x×y) with embedding dimensions $\mathcal{M}$ and $\mathcal{N}$ along directions of the rows and columns, respectively, where ($1 < \mathcal{M} < m$) and ($1 < \mathcal{N} < n$). As described with respect to the 1D case, the embedding dimensions of each matrix $\tau_i$ may be defined based on pitches of target structures in the associated directions in units of pixels. In this form, the grand trajectory matrix $\mathcal{G}$ may be characterized as a Hankel-block-Hankel matrix.

Additionally, it is to be understood that the particular descriptions of the trajectory matrices $\tau$ and the grand trajectory matrix $\mathcal{G}$ in Equations (2)-(4) are provided solely for illustrative purposes and should not be interpreted as limiting. The trajectory matrices $\tau$ and/or a grand trajectory matrix $\mathcal{G}$ may be constructed using any technique suitable for use with any decomposition (e.g., factorization) technique. For example, the trajectory matrices $\tau$ and/or a grand trajectory matrix $\mathcal{G}$ may be constructed in various ways while preserving the completeness property of the vector space spanned.

In some embodiments, the step 204 includes a step 210 of generating reconstruction components associated with the particular image from the one or more trajectory matrices using a decomposition technique.

Any suitable decomposition technique may be utilized such as, but not limited to, SVD, principal component analysis, independent component analysis, or any eigenvalue-based decomposition technique. In some embodiments, the reconstruction vectors describe different spectral components of the signal vector (e.g., different length scales of the signal vector). In this way, the grand trajectory matric $\mathcal{G}$ (or a single trajectory matrix $\tau$) may be expressed as a sum of the reconstruction vectors. Further, as will be described in greater detail below, a pre-processed image may be generated based on a sum of a subset of the reconstruction vectors.

Equations (5)-(7) and FIGS. 4A-4C below provide a non-limiting illustration using an SVD technique in the case of a 1D target (e.g., with a grand trajectory matrix based on equations (2)-(3)). However, it is to be understood that this is merely for illustrative purposes and that the teaching may be extended to the case of a 2D target (e.g., with a grand trajectory matrix based on equation (4)).

For example, applying SVD to the grand trajectory matric $\mathcal{G}$ of equation (2) for the non-limiting example including trajectory matrices for n rows may provide that:

$$\mathcal{G} = U\Sigma V^T = \sum_{p=1}^{n\mathcal{M}} \sigma_p U_p V_p^T = \sum_{p=1}^{n\mathcal{M}} \mathcal{G}_p, \quad (5)$$

where $\Sigma$ is a diagonal matrix containing the singular values $\sigma_1 \ldots \sigma_p$ of $\mathcal{G}$ (in decreasing order from largest to smallest), where $\sigma_1^2 \ldots \sigma_p^2 = \lambda_1 \ldots \lambda_p$ are eigenvalues of the covariance matrix $C = \mathcal{G}^T \mathcal{G}$. Further, the eigenvectors of $C = \mathcal{G}^T \mathcal{G}$ make up the columns of the matrix V, while the eigenvectors of $\mathcal{G} \mathcal{G}^T$ make up the columns of the matrix U. Decomposing $\mathcal{G}$ provides $n\mathcal{M}$ eigenvalues and associated reconstructions of the trajectory matrices $\tau$.

From equation (5), one can generate reconstruction components $R_p$ that satisfy:

$$I_{Orig} = \begin{pmatrix} a_{1,1} & \cdots & a_{1,m} \\ \vdots & \ddots & \vdots \\ a_{n,1} & \cdots & a_{n,m} \end{pmatrix} = \sum_{p=1}^{n\mathcal{M}} \mathcal{R}_p. \quad (6)$$

In this way, the reconstruction components $\mathcal{R}_p$ generated in step 210 may correspond to the different spectral components (e.g., different length scales) of the image $I_{Orig}$.

For example, the matrices $\mathcal{G}_p$ may each include reconstructed versions of the trajectory matrices. From this, reconstructed versions of the rows of the image (e.g., having length m) may be generated by a diagonal operation (e.g., a diagonal mean, or the like) of the corresponding reconstructed versions of the trajectory matrices, where the reconstructed rows may be combined to form an associated reconstruction component $\mathcal{R}_p$.

Referring generally to steps 208 and 210, the selection of the embedding dimension $\mathcal{M}$ may impact both the nature of the decomposition and the computation speed. The embedding dimension $\mathcal{M}$ may generally have any value between 1 and m (the length of a row of the image $I_{Orig}$ in units of pixels.

In some embodiments, the embedding dimension $\mathcal{M}$ is selected to be equal to m (e.g., $\mathcal{M} = m$). In this configuration, a decomposition of the grand trajectory matrix $\mathcal{G}$ may provide reconstruction components based on correlations between rows of the image $I_{Orig}$. Further, this selection of the embedding dimension may result in a simple decomposition (e.g., SVD) of the original image $I_{orig}$. Such an implementation may be computationally fast such that the decomposition may be generated on the fly in many applications.

In some embodiments, the embedding dimension $\mathcal{M}$ is selected to be different than m (e.g., $\mathcal{M} \neq m$) and may correspond to a generalized decomposition. In this configuration, a decomposition of the grand trajectory matrix $\mathcal{G}$ may provide reconstruction components based on correlations between segments of length $\mathcal{M}$ both within rows and between rows. In some embodiments, the embedding dimension $\mathcal{M}$ is selected to be equal to a pitch of the periodic features of the target 104 (e.g., rounded up or down to an integer number of pixels), which may be known when implementing the method 200. Such a configuration may be particularly advantageous since the resulting decomposition may be based on correlations between different periods in a given row as well as between rows. Further, such an implementation may provide a relatively large grand trajectory matrix $\mathcal{G}$ where the reconstruction components may be more statistically valid than the simpler SVD implementation of $\mathcal{M} = m$. As a result, reconstruction components $\mathcal{R}_p$ may effectively distinguish between features having a length scale corresponding to the known pitch from other features with different length scales (e.g., noise, non-uniformities, or the like). However, such an implementation may be relatively computationally time-consuming.

In some embodiments, a generalized decomposition is applied to a limited dataset to balance the decomposition performance with computational speed. For example, a generalized decomposition in which $\mathcal{M} \neq m$ (e.g., $\mathcal{M}$ is selected to be equal to the pitch of the periodic structures) may be applied to a single row of an image (or a 1D measured signal) or applied to an average of multiple rows. Such an implementation may be computationally fast, but retain an accurate reconstruction based on correlations along the measurement direction in the analyzed row.

Referring again to FIG. 2B, in some embodiments, the step 204 includes a step 212 of generating a particular one of the one or more pre-processed images based on a subset of the reconstruction components including signals with at least one of the one or more known pitches. For example, the pre-processed image $I_{pp}$ may be written as $$I_{pp} = \sum_{p=1}^{l} \mathcal{R}_p, \quad (7)$$

where $1 < n\mathcal{M}$. In some embodiments, $1 << n\mathcal{M}$. Accordingly, the step 212 may include identifying a subset l of the reconstruction components that include signals that correspond to the pitch of the target 104 and generating the pre-processed image based on the identified subset l of the reconstruction components. In some cases, the pre-processed image $I_{pp}$ may correspond to a low-rank approximation of the original image $I_{Orig}$. In some cases, the pre-processed image $I_{pp}$ may further remove a DC component (e.g., a constant signal component) or other signals with low spatial frequencies.

Figure 4A:
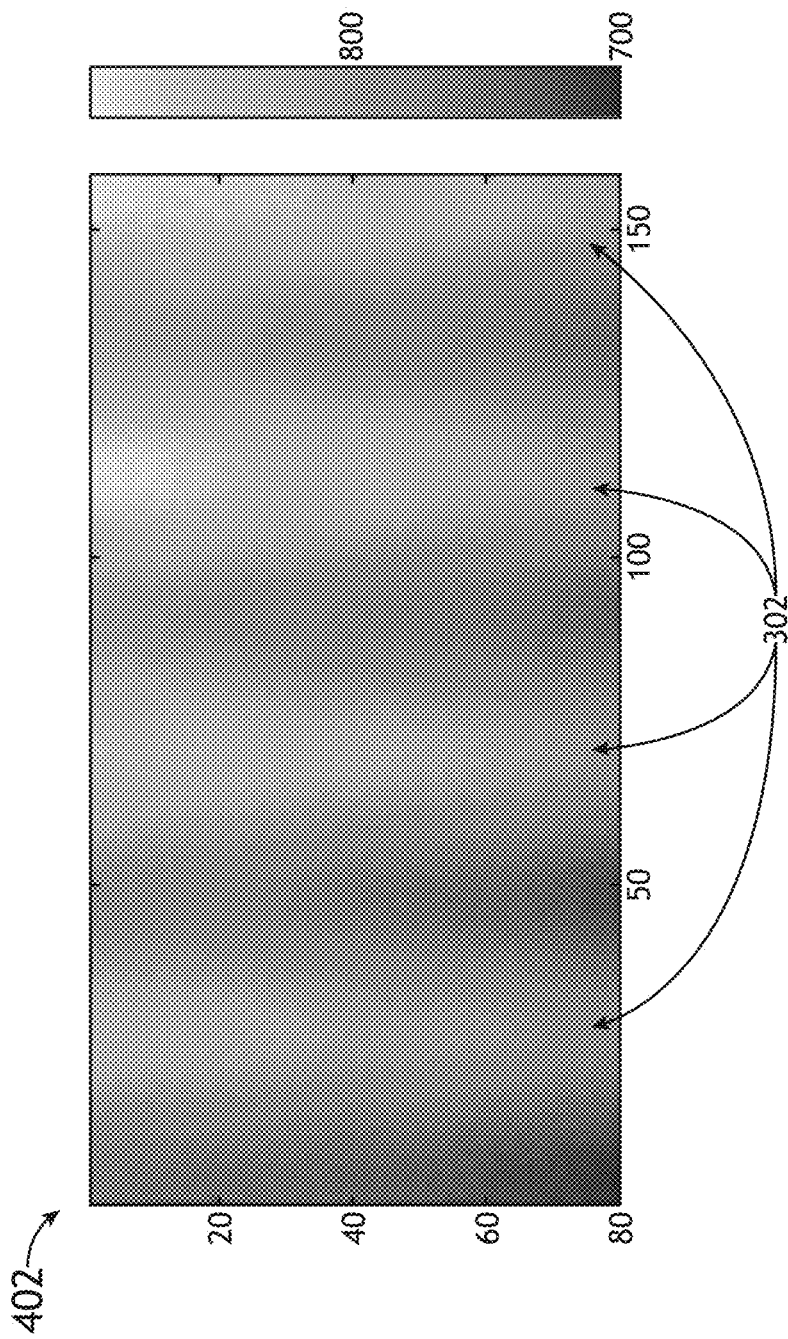
FIG. 4A is an image of periodic structures, in accordance with one or more embodiments of the present disclosure.
Figure 4B:
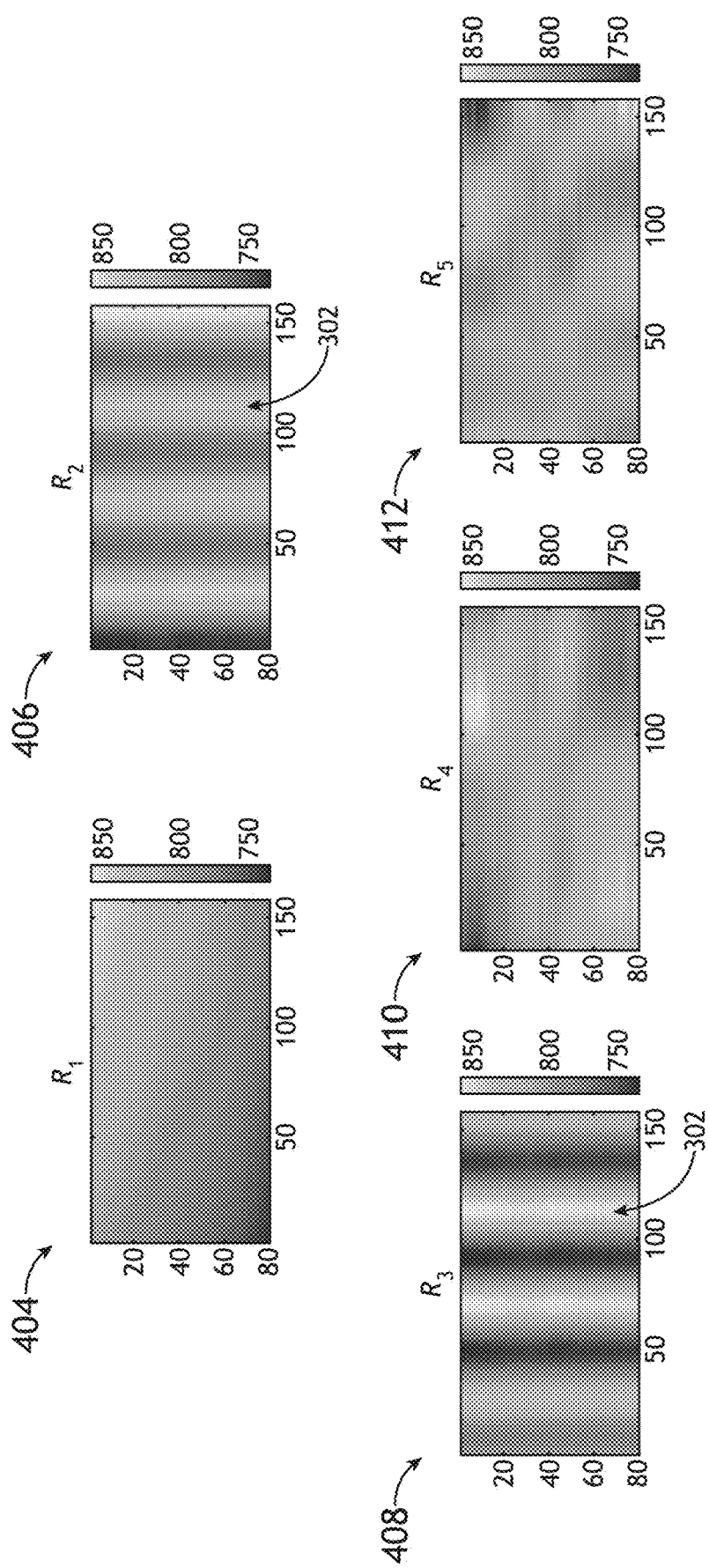
FIG. 4B is a series of images corresponding to reconstruction components associated with the image using a decomposition technique, in accordance with one or more embodiments of the present disclosure.
Figure 4C:
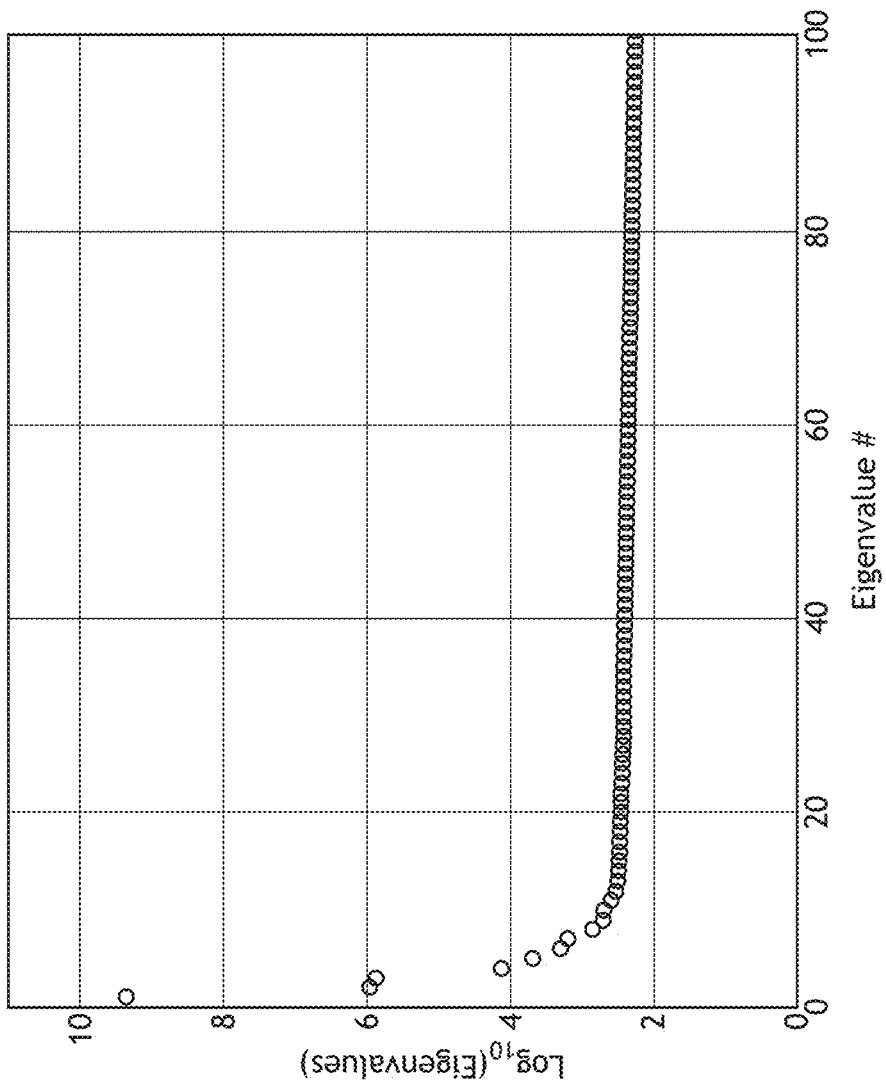
FIG. 4C is a plot of a spectrogram of the eigenvalues of a grand trajectory matrix associated with FIGS. 4A and 4B, in accordance with one or more embodiments of the present disclosure.

Referring now to FIGS. 4A-4C, a demonstration of the method 200 is provided, in accordance with one or more embodiments of the present disclosure.

FIG. 4A is an image 402 of periodic structures 302, in accordance with one or more embodiments of the present disclosure. For example, the image 402 may correspond to an original image $I_{Orig}$ generated by a metrology sub-system 102. Further, the image 402 exhibits substantial non-uniformity, which results in a non-uniform contrast of the periodic structures 302 across the image.

FIG. 4B is a series of images 404-412 (labeled $\mathcal{R}_1$-$\mathcal{R}_5$, respectively) corresponding to reconstruction components associated with the image 402 using a decomposition technique, in accordance with one or more embodiments of the present disclosure. FIG. 4C is a plot of a spectrogram of the eigenvalues of the grand trajectory matrix $\mathcal{G}$ associated with FIGS. 4A and 4B, in accordance with one or more embodiments of the present disclosure. As shown in FIG. 4C, the strength of the eigenvalues (and the associated reconstruction components) drops off rapidly. Thus, the first few eigenvalues (and the associated reconstruction components) may be significant, while the rest correspond to noise.

The images 404-412 in FIG. 4B correspond to the first five reconstruction components of the image 402 associated with the first five eigenvalues generated using SVD of a grand trajectory matrix $\mathcal{G}$ including trajectory matrices for rows of the image 402 with embedding dimension $\mathcal{M}$ selected to be equal to the period of the periodic structures 302 in units of pixels (e.g., a generalized decomposition as described above).

Further, as shown in FIG. 4B, only a few reconstruction components contain significant signal at length scales associated with the pitch of the periodic structures 302. In this particular example, reconstruction components $\mathcal{R}_2$ and $\mathcal{R}_3$ contain substantial signal strength at the pitch of the periodic structures 302 and may be used to generate high-contrast pre-processed images of the periodic structures 302 (e.g., in step 212) in which unwanted noise and/or non-uniformities are at least partially removed. Reconstruction component $\mathcal{R}_1$ represents a DC component (e.g., low spatial frequency component) of the target 104 and associated DC non-uniformities, which may be detrimental to metrology measurements such as, but not limited to, overlay measurements. The remaining reconstruction components (e.g., here $\mathcal{R}_{i>3}$) include noise and/or non-uniformities at higher spatial frequencies that may further be detrimental to the metrology measurements.

It may be possible in some cases to describe the spectral components of the grand trajectory matrix $\mathcal{G}$ (or the original image $I_{Orig}$) in a more efficient form than provided by the reconstruction components. As an illustration, FIG. 4C indicates that the second and third eigenvalues are degenerate or nearly degenerate. This is also evidenced in FIG. 4B in that the reconstruction components $\mathcal{R}_2$ and $\mathcal{R}_3$ are degenerate or nearly degenerate contain similar spatial frequencies. Any suitable decomposition and/or separation technique may be applied to obtain reconstruction components generally and/or reconstruction components used to generate a pre-processed image (e.g., in step 212). For example, a rotation technique such as, but not limited to, varimax rotation, quartimax rotation, or equimax rotation may be utilized to generate reconstruction vectors.

Further, it is noted that Equations (3)-(5) and FIGS. 4A-4C) correspond to a non-parametric decomposition. In some embodiments, the step 204 includes performing a parametric decomposition and regression to provide reconstruction vectors for generating a pre-processed image. Such a technique may use an adaptive basis generated by the data in the original image $I_{Orig}$ and may thus provide a generalized or universal technique suitable for a wide variety of images with different noise and/or non-uniformity issues. Further, such a technique may extract amplitude-modulated sine wave components from the original image $I_{Orig}$ with frequencies different than provided by a standard Fourier decomposition.

The subset of reconstruction vectors used to generate a pre-processed image may be selected at any point. In some embodiments, the subset of reconstruction components used to generate a particular pre-processed image are selected based on an individual analysis of the reconstruction signals and/or the spectrogram of the eigenvalues from a particular original image $I_{Orig}$. For example, the subset of reconstruction components may be selected based on any combination of a signal strength of the reconstruction components at a known pitch of the periodic structures 302 (e.g., a strength of the reconstruction components at spatial frequencies at or near the known pitch as determined through a Fourier or other spectral analysis technique) and/or an eigenvalue strength (e.g., in a spectrogram such as that shown in FIG. 4C). Further, such a selection may be automated such that user intervention is not required. For example, the signal strength of the reconstruction components at the known pitch and/or the eigenvalue strength may be compared to preselected thresholds, which may be generated based on prior experiments and/or simulations.

In some embodiments, the subset of reconstruction components used to generate a particular pre-processed image is based on a prior selection or training. It may be the case that images of targets 104 with a common design across a sample 106 or multiple samples 106 in a lot may exhibit similar noise and/or non-uniformity characteristics such that the particular reconstruction components providing strong signals at the known pitch of periodic structures 302 on the targets 104 (e.g., $\mathcal{R}_2$ and $\mathcal{R}_3$ in the example of FIGS. 4A-4C) may be consistent or at least adhere to measurable patterns. As a result, it may not be sufficient to identify the desired reconstruction components in a training phase and utilize them for additional targets 104 in a test phase without further analysis. For example, the test phase may correspond to a first portion of the targets 104 on a particular sample 106. As another example, the test phase may correspond to a set of one or more training samples 106 analyzed prior to run-time in a production environment. It is contemplated herein that such a train and test technique may reduce the computational burden during run-time such that pre-processed images may be generated efficiently (e.g., nearly instantaneously). In this way, even computationally intensive approaches such as, but not limited to the generalized decomposition (e.g., $\mathcal{M} \neq m$ as described previously herein) may be implemented efficiently during the test phase.

Referring now generally to FIGS. 2A-2B, it is contemplated herein that the systems and methods disclosed herein may be suitable for images that exhibit more than one harmonic component (e.g., different pitches p and/or non-trivial harmonics of any pitches of periodic structures 302 in spatial frequency space). In particular, decomposition techniques as disclosed herein may naturally identify dominant spatial frequencies in an image based on the data in the image itself and further provide reconstruction components that include these spatial frequencies. Put another way, decomposition techniques may automatically provide reconstruction components with an adaptive basis that is based on the data in the image itself.

As a result, the systems and methods disclosed herein may provide filtering of noise and non-uniformities even when non-trivial harmonics are present. For example, a pre-processed image may be generated (e.g., in step 212) based on any combination of reconstruction components that include desired harmonics or spatial frequencies more generally and exclude sources of noise or non-uniformities as described herein.

Further, in some embodiments, one or more pre-processed images may be generated that isolate desired spatial frequencies and/or exclude undesired spatial frequencies. For example, a pre-processed image may be generated in which certain harmonics are intentionally excluded (e.g., to isolate a fundamental spatial frequency). As another example, in a case where a target includes different instances of periodic structures 302 with different pitches (e.g., in a non-overlapping configuration or in an overlapping Moiré configuration), a pre-processed image may be generated that isolates structures with a particular pitch. Further, different pre-processed images may be generated that isolate structures with the different pitches. In this way, features with the different pitches may be separately considered. Such multiple pre-processed images may then be used together to generate one or more metrology measurements (e.g., in step 206).

Referring again to FIG. 2A, the step 206 may include generating metrology measurements based on the pre-processed images using any suitable technique. For example, any technique or algorithm suitable for generating image-based metrology measurements (e.g., on an original image) may be applied to pre-processed images generated in step 204. In this way, the step 204 may improve a quality of a metrology measurement based on any number of metrics such as, but not limited to, accuracy, sensitivity, or robustness.

For example, the pre-processing technique based on decomposition and selection of reconstruction signals $\mathcal{R}_p$ that include data associated with the length scale of the known pitch may both provide a high-contrast image of the periodic features and effectively filter out unwanted signals (e.g., associated with noise, non-uniformities, or the like) that may negatively impact an image-based metrology measurement.

As an illustration, the systems and methods disclosed herein may be particularly suitable for the non-limiting application of overlay metrology. For example, image-based overlay metrology techniques typically involve one of two approaches. A first approach is based on Fourier series decomposition regression (e.g., for harmonics generated by periodic structures 302) and a cross-correlation filter. However, even simple linear trends and/or constant-term non-uniformities (e.g., in the Fourier series decomposition) may contribute to significant errors in the overlay measurement. A second approach is based on comparing phases of different instances of periodic structures 302 in one or more images. Such phase-based techniques may be more naturally robust to the types of non-uniformities detrimental to a cross-correlation technique (e.g., which may be up to quadratic in a local expansion), but may critically require only a single dominant harmonic in the kernels (e.g., the image). As a result, the presence of any additional harmonics may result in substantial overlay errors. Broadly speaking, typical image-based overlay measurement techniques cannot simultaneously accept more than one harmonic in the signal (e.g., the image) while also being robust to non-uniformities and target noise.

However, the systems and methods disclosed herein are suitable for filtering out noise and/or image non-uniformities even in the presence of harmonics in the signal (e.g., harmonics in spatial frequency space due to edges of periodic structures 302). In this way, the systems and methods disclosed herein may be suitable for improving overlay measurements generated using any image-based technique including, but not limited to, a cross-correlation or a phase-based technique.

The method 200 may further include controlling one or more process tools based on metrology measurements generated in step 206. For example, metrology data associated with any number of targets 104 distributed across one or more samples 106 may be used to generate correctables for controlling process tools while fabricating additional samples 106. As an illustration, metrology data for samples 106 in a lot may be used to generate feedback correctables for controlling the lithographic exposure of subsequent samples 106 in the same lot. As another illustration, metrology data for samples 106 in a lot may be used to generate feed-forward correctables for controlling lithographic exposures for the same or similar samples 106 in subsequent lithography steps to account for any deviations.

Referring again to FIGS. 1A-1C, various aspects of the metrology system 100 are described in greater detail, in accordance with one or more embodiments of the present disclosure.

Figure 1B:
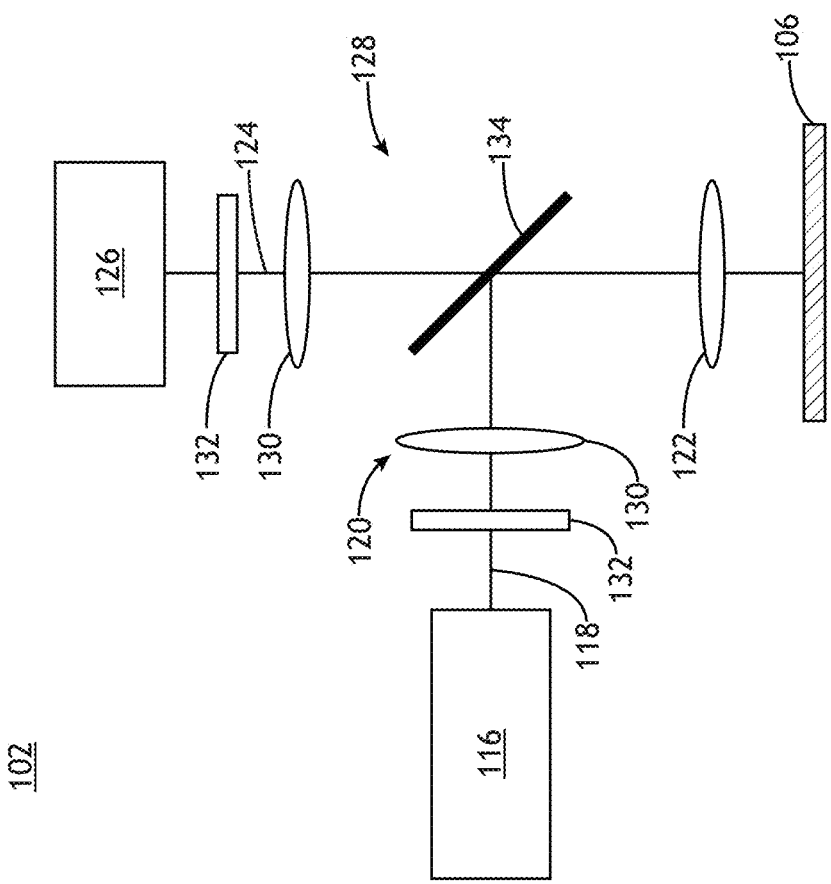
FIG. 1B is a conceptual diagram of an optical metrology sub-system, in accordance with one or more embodiments of the present disclosure.

In some embodiments, the metrology sub-system 102 is an optical sub-system that generates a metrology measurement by illuminating the target 104 with light and collecting light from the target 104 as the basis of the measurement. FIG. 1B is a conceptual diagram of an optical metrology sub-system 102, in accordance with one or more embodiments of the present disclosure.

An optical metrology sub-system 102 may generally include an illumination source 116 to generate an illumination beam 118 having any spectrum or temporal profile, an illumination pathway 120 to direct the illumination beam 118 to a target 104, an objective lens 122 or other suitable component to collect light from the target 104 (referred to herein as sample light 124), a detector 126, and a collection pathway 128 to direct the sample light 124 to the detector 126. The illumination pathway 120 and/or the collection pathway 128 may include any number or type of lenses 130 or other optical elements 132 suitable for manipulating the illumination beam 118 and/or the sample light 124 such as, but not limited to, one or more polarizers, one or more beamsplitters 134, one or more homogenizers, or one or more apodizers.

An optical metrology sub-system 102 may generate a metrology measurement using any suitable technique. In some embodiments, an optical metrology sub-system 102 generates a metrology measurement based on an image of the target 104 (e.g., a field-plane image in which the detector 126 is in a field plane conjugate to the sample 106). In some embodiments, an optical metrology sub-system 102 generates a metrology measurement using a scatterometry technique based on collected diffraction orders (e.g., as measured by a detector 126 in a pupil plane). Further, the sample 106 may either be static or in motion during a measurement.

Figure 1C:
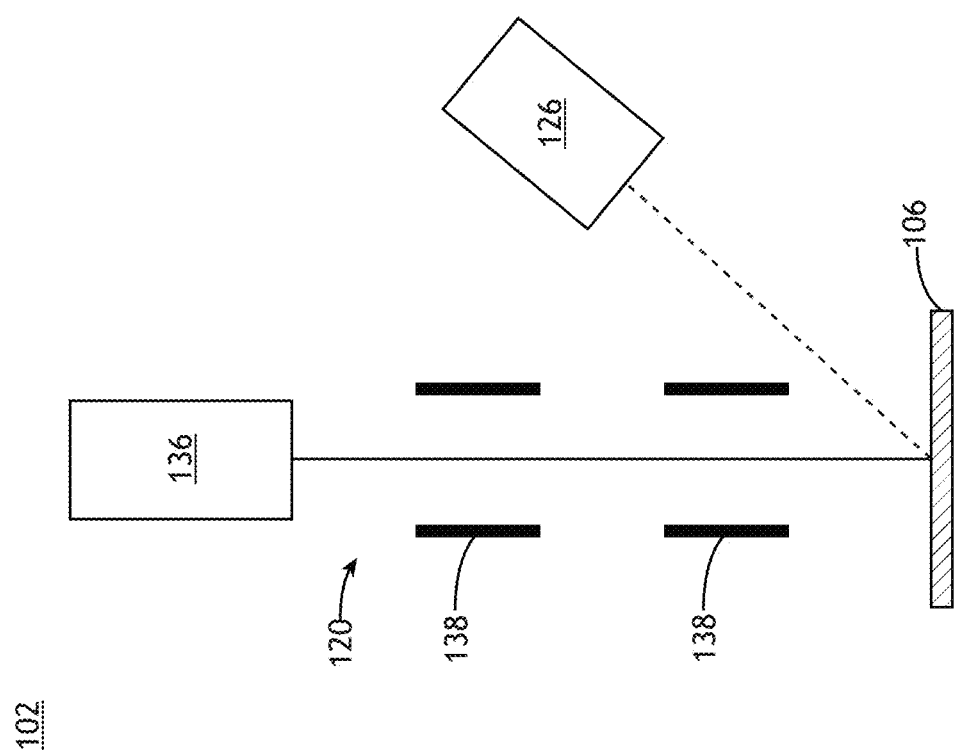
FIG. 1C is a conceptual diagram of a particle-beam metrology sub-system, in accordance with one or more embodiments of the present disclosure.

In some embodiments, the metrology sub-system 102 is a particle-beam sub-system that generates a metrology measurement by illuminating the target 104 with a particle beam (e.g., an electron beam, an ion beam, a neutral particle beam, or the like) and collecting any combination of particles or light from the target 104 as the basis of the measurement. FIG. 1C is a conceptual diagram of a particle-beam metrology sub-system 102, in accordance with one or more embodiments of the present disclosure.

A particle-beam metrology sub-system 102 may include a particle source 136 (e.g., an electron beam source, an ion beam source, or the like) such that an illumination beam 118 includes a particle beam (e.g., an electron beam, a particle beam, or the like). The illumination source 116 may include any particle source known in the art suitable for generating an illumination beam 118. For example, the illumination source 116 may include, but is not limited to, an electron gun or an ion gun. A particle-beam metrology sub-system 102 may further include an illumination pathway 120 with one or more particle beam lenses 138 (e.g., electrostatic, magnetic, uni-potential, double-potential lenses, or the like) or other beam manipulation elements (not shown) to control one or more aspects of the illumination beam 118 such as, but not limited to, one or more stigmators or aberration-control elements. A particle-beam metrology sub-system 102 may further include a collection pathway 128 to direct any combination of particles or light to at least one detector 126. For example, the detector 126 may include an electron collector (e.g., a secondary electron collector, a backscattered electron detector, or the like). As another example, the detector 126 may include a photon detector (e.g., a photodetector, an x-ray detector, a scintillating element coupled to photomultiplier tube (PMT) detector, or the like) for detecting electrons and/or photons from the sample surface. As an illustration, FIG. 1C depicts a detector 126 arranged to capture secondary electrons emitted from the target 104.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system comprising:
   a controller including one or more processors configured to execute program instructions causing the one or more processors to implement a metrology recipe by:
   receiving one or more images of a metrology target including periodic features with one or more known pitches;
   pre-processing the one or more images using a decomposition technique to generate one or more pre-processed images, wherein pre-processing a particular image of the one or more images comprises:
   constructing one or more trajectory matrices from the particular image;
   generating reconstruction components associated with the particular image from the one or more trajectory matrices using the decomposition technique;
   selecting, from among the generated reconstruction components, reconstruction components including signals with at least one of the one or more known pitches, the selected reconstruction components forming a subset of the reconstruction components; and
   generating a particular one of the one or more pre-processed images based on the subset of the reconstruction components including signals with at least one of the one or more known pitches; and
   generating one or more metrology measurements for the metrology target based on the one or more pre-processed images.

2. The system of claim 1, wherein generating the reconstruction components associated with the particular image from the one or more trajectory matrices using the decomposition technique comprises:
   generating the reconstruction components associated with the particular image from the one or more trajectory matrices using a singular value decomposition (SVD) technique.

3. The system of claim 1, wherein generating the reconstruction components associated with the particular image from the one or more trajectory matrices using the decomposition technique comprises:
   generating the reconstruction components associated with the particular image from the one or more trajectory matrices using at least one of a principal component analysis technique or an independent component analysis technique.

4. The system of claim 1, wherein the particular image is defined as:

$$I_{Orig} = \begin{pmatrix} a_{1,1} & \cdots & a_{1,m} \\ \vdots & \ddots & \vdots \\ a_{n,1} & \cdots & a_{n,m} \end{pmatrix},$$

wherein n represents rows of the particular image, wherein m represents columns of the particular image, wherein the one or more trajectory matrices are associated with one or more rows of the particular image, wherein the one or more trajectory matrices have an embedding dimension $\mathcal{M}$, wherein $(1 < \mathcal{M} \leq m)$.

5. The system of claim 4, wherein $\mathcal{M} = m$.

6. The system of claim 4, wherein $\mathcal{M} \neq m$.

7. The system of claim 6, wherein $\mathcal{M}$ corresponds to a value of one of the one or more known pitches in pixel units rounded to an integer.

8. The system of claim 4, wherein the one or more trajectory matrices include $$\tau_k = \begin{pmatrix} a_{k,1} & a_{k,2} & a_{k,3} & \cdots & a_{k,\mathcal{M}} \\ a_{k,2} & a_{k,3} & a_{k,4} & \cdots & a_{k,\mathcal{M}+1} \\ \vdots & \vdots & \vdots & \ddots & \vdots \\ a_{k,m-\mathcal{M}+1} & a_{k,m-\mathcal{M}+2} & a_{k,m-\mathcal{M}+3} & \cdots & a_{k,m} \end{pmatrix}_{(m-\mathcal{M}+1) \times \mathcal{M}}$$

for k=1, 2, . . . n, wherein a grand trajectory matrix $\mathcal{G}$ is formed as $\mathcal{G} = (\tau_1 \cdots \tau_n)_{(m-\mathcal{M}+1) \times n\mathcal{M}}$, wherein generating the reconstruction components associated with the particular image from the one or more trajectory matrices using the decomposition technique comprises:
   generating the reconstruction components associated with the particular image from the grand trajectory using the decomposition technique.

9. The system of claim 4, wherein the trajectory matrices include a single trajectory matrix associated with a single one of the rows of the particular image.

10. The system of claim 4, wherein the trajectory matrices include a single trajectory matrix associated with an average of at least two of the rows of the particular image.

11. The system of claim 1, wherein the particular image is defined as:

$$I_{Orig} = \begin{pmatrix} a_{1,1} & \cdots & a_{1,m} \\ \vdots & \ddots & \vdots \\ a_{n,1} & \cdots & a_{n,m} \end{pmatrix},$$

wherein n represents rows of the particular image, wherein m represents columns of the particular image, wherein a grand trajectory matrix $\mathcal{G}$ is formed from the one or more trajectory matrices as:

$$\mathcal{G} = \begin{pmatrix} \tau_1 & \tau_2 & \tau_3 & \cdots & \tau_y \\ \tau_2 & \tau_3 & \tau_4 & \cdots & \tau_{y+1} \\ \vdots & \vdots & \vdots & \ddots & \vdots \\ \tau_x & \tau_{x+1} & \tau_{x+2} & \cdots & \tau_N \end{pmatrix}_{(m-\mathcal{M}+1)\times\mathcal{M}},$$

where each matrix τ is one of the one or more trajectory matrices with embedding dimensions $\mathcal{M}$ and $\mathcal{N}$ along directions of the rows and the columns of the particular image, respectively, wherein ($1 < \mathcal{M} \leq m$) and ($1 < \mathcal{N} \leq n$).

12. The system of claim 11, wherein $\mathcal{M}$ corresponds to a value of one of the one or more known pitches along the rows in pixel units rounded to an integer, wherein $\mathcal{N}$ corresponds to a value of one of the one or more known pitches along the columns in pixel units rounded to an integer.

13. The system of claim 1, wherein the subset of the reconstruction components including the signals with at least one of the one or more known pitches is determined for each of the one or more images.

14. The system of claim 1, wherein the subset of the reconstruction components including the signals with at least one of the one or more known pitches is determined based on one or more training images.

15. The system of claim 1, wherein the metrology measurements comprise:
overlay measurements.

16. The system of claim 1, wherein the program instructions are further configured to cause the one or more processors to control a lithography tool based on the one or more metrology measurements.

17. A system comprising:
a metrology sub-system; and
a controller communicatively coupled with the metrology subsystem, the controller including one or more processors configured to execute program instructions causing the one or more processors to implement a metrology recipe by:
 receiving one or more images of a metrology target including periodic features with one or more known pitches from the metrology sub-system;
 pre-processing the one or more images using a decomposition technique to generate one or more pre-processed images, wherein pre-processing a particular image of the one or more images comprises:
  constructing one or more trajectory matrices from the particular image;
  generating reconstruction components associated with the particular image from the one or more trajectory matrices using the decomposition technique;
  selecting, from among the generated reconstruction components, reconstruction components including signals with at least one of the one or more known pitches, the selected reconstruction components forming a subset of the reconstruction components; and
  generating a particular one of the one or more pre-processed images based on the subset of the reconstruction components including signals with at least one of the one or more known pitches; and
 generating one or more metrology measurements for the metrology target based on the one or more pre-processed images.

18. The system of claim 17, wherein the program instructions are further configured to cause the one or more processors to control a lithography tool based on the one or more metrology measurements.

19. The system of claim 17, wherein the metrology sub-system comprises:
an optical metrology imaging sub-system.

20. The system of claim 17, wherein the metrology sub-system comprises:
a particle-beam imaging sub-system.

21. A method comprising:
receiving one or more images of a metrology target including periodic features with one or more known pitches;
pre-processing the one or more images using a decomposition technique to generate one or more pre-processed images, wherein pre-processing a particular image of the one or more images comprises:
 constructing one or more trajectory matrices from the particular image;
 generating reconstruction components associated with the particular image from the one or more trajectory matrices using the decomposition technique;
 selecting, from among the generated reconstruction components, reconstruction components including signals with at least one of the one or more known pitches, the selected reconstruction components forming a subset of the reconstruction components; and
 generating a particular one of the one or more pre-processed images based on the subset of the reconstruction components including signals with at least one of the one or more known pitches; and
generating one or more metrology measurements for the metrology target based on the one or more pre-processed images.

22. The method of claim 21, wherein generating the reconstruction components associated with the particular image from the one or more trajectory matrices using the decomposition technique comprises:
generating the reconstruction components associated with the particular image from the one or more trajectory matrices using a singular value decomposition (SVD) technique.

23. The method of claim 21, wherein generating the reconstruction components associated with the particular image from the one or more trajectory matrices using the decomposition technique comprises:
generating the reconstruction components associated with the particular image from the one or more trajectory matrices using at least one of a principal component analysis technique or an independent component analysis technique.

* * * * *